United States Patent
Kuo et al.

(10) Patent No.: US 11,289,625 B2
(45) Date of Patent: Mar. 29, 2022

(54) LIGHT EMITTING DIODE OF IMPROVED LIGHT EXTRACTION RATE

(71) Applicant: Lextar Electronics Corporation, Hsinchu (TW)

(72) Inventors: Shiou-Yi Kuo, Hsinchu (TW); Te-Chung Wang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 4 days.

(21) Appl. No.: 16/742,891

(22) Filed: Jan. 14, 2020

(65) Prior Publication Data

US 2020/0235266 A1 Jul. 23, 2020

(30) Foreign Application Priority Data

Jan. 17, 2019 (CN) .......................... 201910042124.9

(51) Int. Cl.
*H01L 33/40* (2010.01)
*H01L 33/38* (2010.01)
*H01L 33/42* (2010.01)
*H01L 33/22* (2010.01)
*H01L 33/44* (2010.01)

(52) U.S. Cl.
CPC ............ *H01L 33/405* (2013.01); *H01L 33/22* (2013.01); *H01L 33/38* (2013.01); *H01L 33/42* (2013.01); *H01L 33/44* (2013.01)

(58) Field of Classification Search
CPC ....... H01L 33/22; H01L 33/405; H01L 33/38; H01L 33/42; H01L 33/44; H01L 33/387; H01L 33/382; H01L 33/46
See application file for complete search history.

(56) References Cited

U.S. PATENT DOCUMENTS

| 7,183,586 | B2 | 2/2007 | Ichihara et al. |
| 7,294,864 | B2 | 11/2007 | Kim et al. |
| 7,713,776 | B1 * | 5/2010 | Horng ................. H01L 33/0093 438/69 |
| 7,777,241 | B2 | 8/2010 | Moustakas et al. |

(Continued)

FOREIGN PATENT DOCUMENTS

| CN | 102969414 A | 3/2013 |
| CN | 104659176 A | 5/2015 |

(Continued)

*Primary Examiner* — Stephen M Bradley
(74) *Attorney, Agent, or Firm* — CKC & Partners Co., LLC

(57) ABSTRACT

A light emitting diode includes a first type semiconductor layer, an active layer, a second type semiconductor layer, a patterned electrode layer, a flat layer and a reflective layer. The active layer is disposed on the first type semiconductor layer. The second type semiconductor layer is disposed on the active layer. The second type semiconductor layer includes a first surface and a second surface having a first arithmetic mean roughness. The patterned electrode layer is disposed on the second surface of the second type semiconductor layer. The planarization layer is disposed on the second type semiconductor layer. The planarization layer includes a third surface and a fourth surface. The third surface is in contact with the second surface of the second type semiconductor layer. The fourth surface has a second arithmetic mean roughness that is less than the first arithmetic mean roughness.

13 Claims, 4 Drawing Sheets

(56) References Cited

U.S. PATENT DOCUMENTS

| | | | |
|---|---|---|---|
| 7,915,629 B2 | 3/2011 | Li et al. | |
| 8,525,204 B2 | 9/2013 | Fukshima et al. | |
| 9,209,356 B2 | 12/2015 | Chen et al. | |
| 9,293,648 B1 | 3/2016 | Zhang et al. | |
| 9,899,572 B2 * | 2/2018 | Ishiguro | H01L 33/46 |
| 2010/0117070 A1 | 5/2010 | Adekore et al. | |
| 2010/0207147 A1 | 8/2010 | Kim | |
| 2011/0024783 A1 * | 2/2011 | Horng | H01L 33/22 |
| | | | 257/98 |
| 2014/0319559 A1 * | 10/2014 | Guo | H01L 33/22 |
| | | | 257/97 |
| 2019/0081213 A1 * | 3/2019 | Chang | H01L 33/30 |

FOREIGN PATENT DOCUMENTS

| | | |
|---|---|---|
| CN | 105355742 A | 2/2016 |
| JP | 5186259 B2 | 4/2013 |
| TW | I244221 B | 11/2005 |
| TW | I370560 B1 | 8/2012 |
| TW | I373153 B | 9/2012 |

* cited by examiner

LIGHT EMITTING DIODE OF IMPROVED LIGHT EXTRACTION RATE

CROSS-REFERENCE TO RELATED APPLICATION

This application claims priority to China Application No 201910042124.9, filed Jan. 17, 2019, the entirety of which is incorporated herein by reference.

BACKGROUND

Field of Invention

The present disclosure relates to light emitting diodes.

Description of Related Art

Due to the energy-saving and environmentally friendly characteristics of the light emitting diode, it is considered as a new generation of mainstream lighting devices. In order to obtain a high-luminance light emitting diode, it is necessary to increase the light extraction rate of the light emitting diode. However, due to the higher refractive index of the semiconductor material, only a small portion of the light generated by the light emitting diode is radiated to the outside, and most of the energy is absorbed by the electrode or semiconductor material after numerous times of total reflection, especially for lights of short wavelengths, such as UVC, which is more problematic, resulting in lower luminous efficiency of the light emitting diode. Therefore, a novel light emitting diode is needed to address the above problems.

SUMMARY

According to one aspect of the present disclosure, a light emitting diode includes a first type semiconductor layer, an active layer, a second type semiconductor layer, a patterned electrode layer, a planarization layer and a reflective layer. The active layer is disposed on the first type semiconductor layer. The second type semiconductor layer is disposed on the active layer, and includes a first surface and a second surface opposite thereto, wherein the first surface faces the active layer, and the second surface has a first arithmetic mean roughness. The patterned electrode layer is disposed on the second surface of the second type semiconductor layer and exposes a portion of the second type semiconductor layer. The planarization layer is disposed on the exposed portion of the second semiconductor layer, and includes an opening exposing a portion of the patterned electrode layer. Further, the planarization layer includes a third surface and a fourth surface opposite thereto, and the third surface contacts the second surface of the second type semiconductor layer. The fourth surface has a second arithmetic mean roughness which is less than the first arithmetic mean roughness. The reflective layer contacts the fourth surface of the planarization layer.

According to one or more embodiments of the present disclosure, the patterned electrode layer comprises a plurality of electrodes, and each of the plurality of electrodes is spaced apart from each other.

According to one or more embodiments of the present disclosure, the light emitting diode further comprises a first contact and a second contact, wherein the first contact is electrically connected to the first type semiconductor layer, and the second contact is electrically connected to the reflective layer.

According to one or more embodiments of the present disclosure, a maximum height roughness of the second surface is greater than 100 Å.

According to one or more embodiments of the present disclosure, the second arithmetic mean roughness of the fourth surface is less than 3 Å.

According to one or more embodiments of the present disclosure, the reflective layer covers the patterned electrode layer and the planarization layer.

According to one or more embodiments of the present disclosure, the reflective layer is electrically connected to the patterned electrode layer through the opening.

According to one or more embodiments of the present disclosure, the planarization layer comprises an insulating oxide or nitride.

According to one or more embodiments of the present disclosure, the reflective layer comprises a metal reflective material.

According to one or more embodiments of the present disclosure, the patterned electrode layer comprises a light-transmitting conductive oxide.

The present disclosure provides a structure of a light emitting diode, which improves the problem of total reflection, improves the reflection effect of the reflective layer, and further improves the light extraction rate of the entire light-emitting diode.

BRIEF DESCRIPTION OF THE DRAWINGS

The disclosure will be better understood from the following detailed description when read in conjunction with the drawings. It should be emphasized that, depending on the standard practice in the industry, the features are not drawn to scale and are for illustrative purposes only. In fact, the dimensions of the features can be arbitrarily increased or decreased for clarity of discussion.

DETAILED DESCRIPTION

Figure 1:
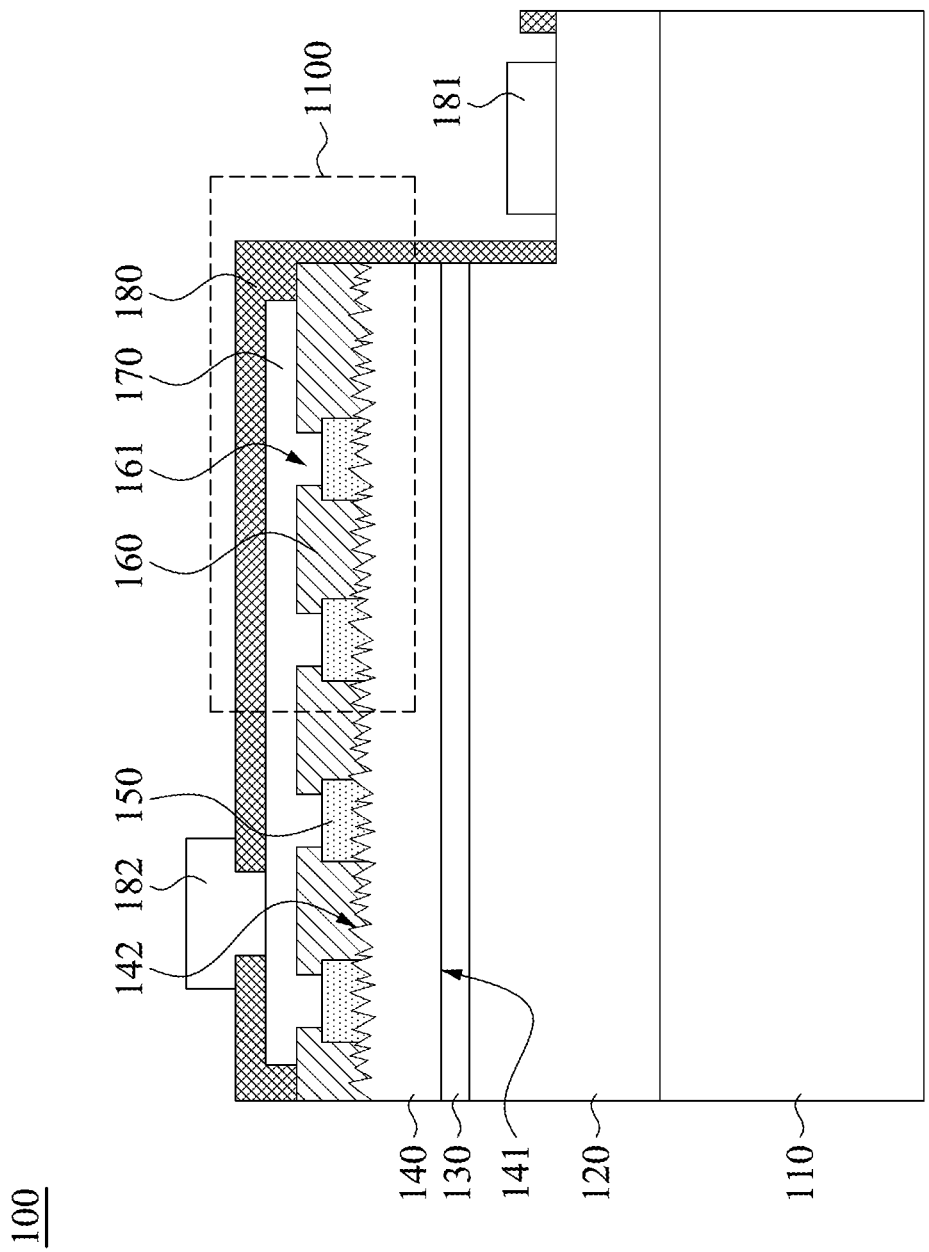
FIG. 1 is a cross-sectional view of a light emitting diode 100 according to an embodiment of the present disclosure.

The following disclosure provides many different embodiments or examples for implementing different features of the present disclosure. Specific examples of components and permutations are described below to simplify the disclosure of the present disclosure. Of course, the examples are merely examples and are not intended to be limiting. For example, in the following description, the disclosure of the first feature being formed on or above the second feature includes an embodiment in which the first feature is in direct contact with the second feature, and may also include an embodiment in which the first feature is not in direct contact with the second feature.

Furthermore, in the various examples of the present disclosure, the reference numerals and/or letters may be repeated. This repetition is for the sake of simplicity and does not indicate a relationship between the various embodiments and/or configurations discussed. Furthermore, in the present disclosure, the following features are formed, connected to and/or coupled to another feature, this may include embodiments in which the features form a direct contact, and may also include embodiments in which additional features are inserted to form features such that the features are not in direct contact. Further, for ease of description, spatially relative terms (such as "below", "lower", "above", "upper", and the like) may be used herein to describe one of the elements illustrated in the figures or a relationship of a feature to another element (or elements) or feature (or features). Spatially relative terms are intended to encompass different orientations of the elements in use or operation.

The present disclosure provides a light emitting diode, which can greatly increase the light extraction rate and also reduce the contact resistance between the layers.

Refer to FIG. 1, which is a cross-sectional view of a light emitting diode 100 according to an embodiment of the present disclosure. The light emitting diode 100 includes a first type semiconductor layer 120, an active layer 130, a second type semiconductor layer 140, a patterned electrode layer 150, a planarization layer 160 and a reflective layer 170.

The active layer 130 is disposed on the first type semiconductor layer 120. In some embodiments, the active layer 130 is a multiple quantum well (MQW) having a multi-layered structure. The multi-layered quantum well structure can be constructed by alternately stacking a plurality of well layers and a plurality of barrier layers. In some embodiments, the well layer may be, for example, indium gallium nitride (InGaN) or aluminum gallium nitride (AlGaN), and the barrier layer may be, for example, gallium nitride (GaN) or aluminum gallium nitride (AlGaN). The quantum well allows electrons and holes to have a higher possibility to combine with each other and then generates light, that improves the luminous efficiency of the light emitting diode. Therefore, the active layer 130 also serves as a light emitting layer of the light-emitting diode 100.

The second type semiconductor layer 140 is disposed on the active layer 130. The doping type of the second type semiconductor layer 140 is different from that of the first type semiconductor layer 120. For example, the first type semiconductor layer 120 may be N-type doped, and the second type semiconductor layer 140 may be P-type doped. In some embodiments, the second type semiconductor layer 140 is P-type doped gallium nitride (GaN). The second type semiconductor layer 140 includes a first surface 141 and a second surface 142 opposite to the first surface 141. In some embodiments, the first surface 141 contacts the active layer 130.

The patterned electrode layer 150 is disposed on the second surface 142 of the second type semiconductor layer 140 and exposes a portion of the second type semiconductor layer 140. In some embodiments, the patterned electrode layer 150 comprises a light-transmitting conductive oxide. For example, the patterned electrode layer 150 may include indium tin oxide (ITO), indium zinc oxide (IZO), aluminum zinc oxide (AZO), zinc oxide (ZnO), or zinc gallium oxide (GZO). Herein, the term "light-transmitting conductive oxide" means an oxide material which allows light emitted from the active layer 130 to transmit there through. In some embodiments, the patterned electrode layer 150 is transparent. The patterned electrode layer 150 may form a good ohmic contact with the second type semiconductor layer 140 such that the resistance of the light emitting diode 100 is decreased.

The planarization layer 160 is disposed on the exposed portion of the second type semiconductor layer 140. The planarization layer 160 includes an opening 161 that exposes a portion of the patterned electrode layer 150. In some embodiments, the planarization layer 160 comprises an insulating oxide or nitride, such as silicon oxide ($SiO_x$), titanium dioxide ($TiO_2$), tantalum pentoxide ($Ta_2O_5$), hafnium oxide ($HfO_2$), magnesium oxide (MgO) or silicon nitride ($SiN_x$).

The reflective layer 170 is disposed on the patterned electrode layer 150 and the planarization layer 160. The reflective layer 170 is used to reflect the light emitted by the active layer 130 toward the patterned electrode layer 150, thereby improving the light extraction rate of the light emitting diode 100. Therefore, the reflective layer 170 needs to be made of a material capable of reflecting light. In some embodiments, the reflective layer 170 comprises a metallic reflective material such as aluminum, silver, gold or rhodium.

In some embodiments, the LED 100 further includes a first contact 181 and a second contact 182. The first contact 181 is electrically connected to the first type semiconductor layer 120, and the second contact 182 is electrically connected to the reflective layer 170. Specifically, the reflective layer 170 contacts the patterned electrode layer 150, and the patterned electrode layer 150 contacts the second type semiconductor layer 140. Therefore, the second contact 182 is also electrically connected to the second type semiconductor layer 140.

In some embodiments, the light emitting diode 100 further includes an insulating layer 180 covering the reflective layer 170, the planarization layer 160, and the sidewalls of the first type semiconductor layer 120, the active layer 130, and the second type semiconductor layer 140. The insulating layer 180 can provide better mechanical strength to prevent the first type semiconductor layer 120, the active layer 130, and the second type semiconductor layer 140 from damage.

In some embodiments, the components described above are all formed on the substrate 110. Therefore, the first type semiconductor layer 120, the active layer 130, the second type semiconductor layer 140, the patterned electrode layer 150, the planarization layer 160, and the reflective layer 170 are disposed on the substrate 110. Further, in some embodiments, the substrate 110 may be removed after forming the above-described components to reduce the overall thickness of the light emitting diode 100.

Figure 2:
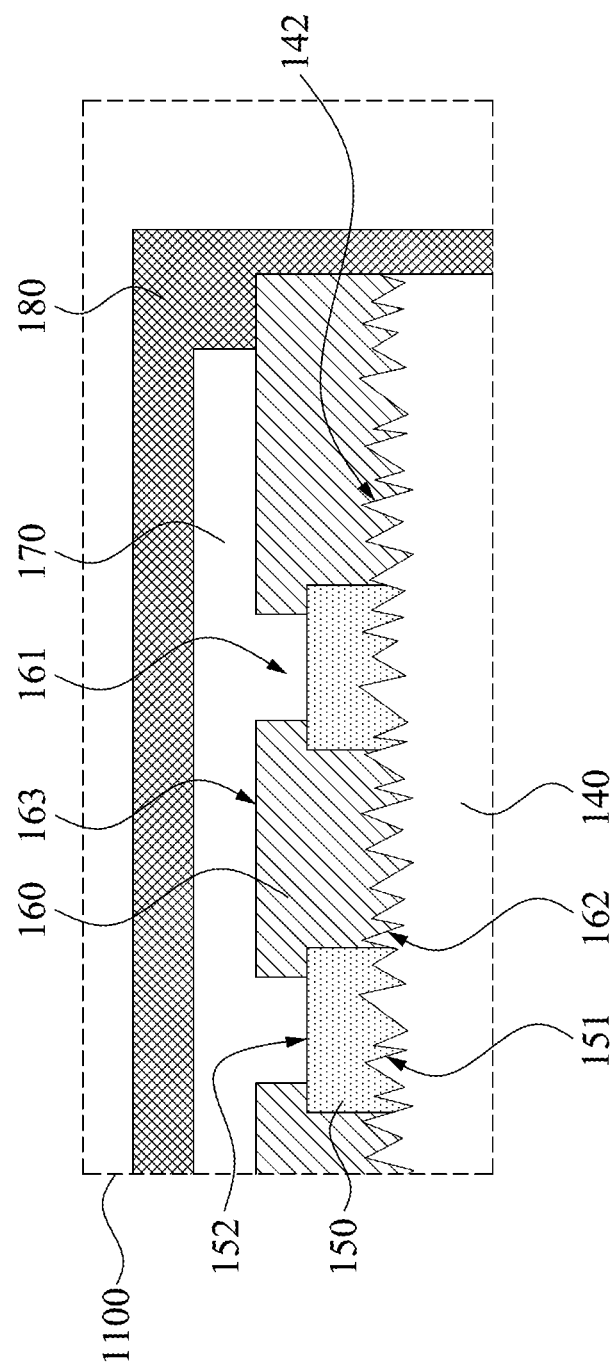
FIG. 2 is an enlarged schematic view showing a region 1100 of FIG. 1.

Refer to FIG. 2, which is an enlarged schematic view of a region 1100 of FIG. 1. The planarization layer 160 includes a third surface 162 and a fourth surface 163 opposite to each other, in which the third surface 162 contacts the second surface 142 of the second type semiconductor layer 140, and the fourth surface 163 contacts the reflective layer 170. It is noted that the fourth surface 163 of the planarization layer 160 is substantially flat, whereas the second surface 142 of the second type semiconductor layer 140 is a roughened surface. Further, the arithmetic mean roughness Ra (also referred to as "arithmetic mean deviation") of the fourth surface 163 of the planarization layer 160 is smaller than the arithmetic mean roughness Ra of the second surface 142 of the second type semiconductor layer 140. Moreover, in some embodiments, the second surface 142 of the second type semiconductor layer 140 has a maximum height roughness Rz (also referred to as "maximum height of profile") of greater than 100 Å, such as 150 Å, 200 Å, 300 Å, or 500 Å.

The maximum height roughness Rz refers to the value of the maximum peak height Rp plus the maximum valley depth Rv within the sampling range. In some embodiments, the fourth surface 163 of the planarization layer 160 has an arithmetic mean roughness Ra of less than 3 Å, such as 2 Å or 1 Å.

In some embodiments, the reflective layer 170 covers the patterned electrode layer 150 and the planarization layer 160, and a portion of the reflective layer 170 is disposed in the opening 161. Therefore, the reflective layer 170 is electrically connected to the patterned electrode layer 150 through the opening 161.

In addition, the patterned electrode layer 150 includes an upper surface 152 and a lower surface 151. The lower surface 151 contacts the second surface 142 of the second type semiconductor layer 140. In other words, the lower surface 151 extends along the second surface 142 and has a rough surface similar to the second surface 142.

It should be noted that since the second surface 142 of the second type semiconductor layer 140 is a roughened surface, it prevents the light emitted from the active layer 130 from continuing to be totally reflected between the second type semiconductor layer 140 and the first type semiconductor layer 120. As a result, the light extraction rate of the light emitting diode is increased. Furthermore, since the contact surface of the reflective layer 170 and the planarization layer 160 is substantially flat, the reflective layer 170 can reflect a larger amount of light and increase the light extraction rate of the light-emitting diode.

Figure 3:
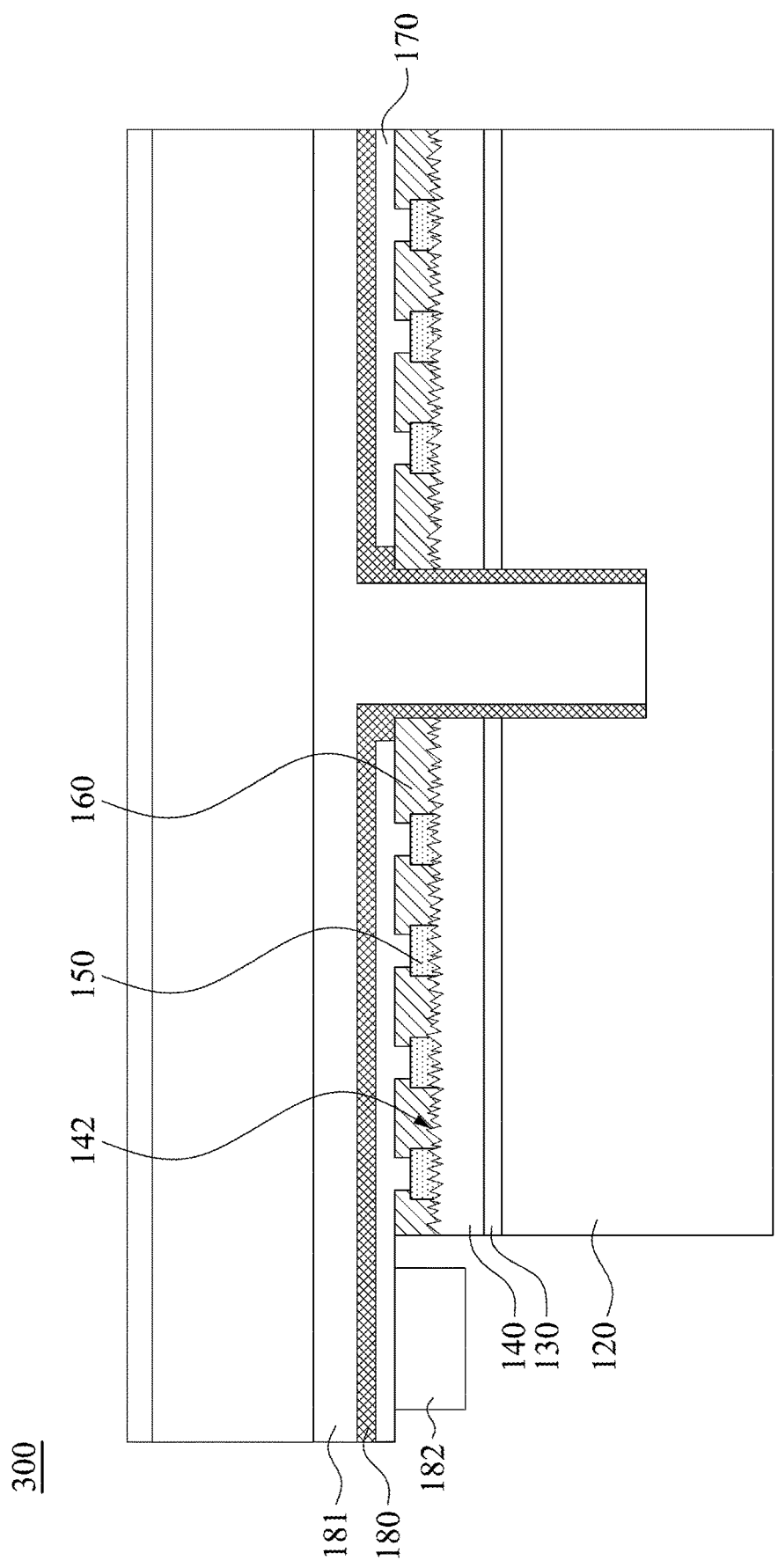
FIG. 3 is a cross-sectional view of a light emitting diode 300 according to another embodiment of the present disclosure.

Refer to FIG. 3, which is a cross-sectional view of a light emitting diode 300 according to another embodiment of the present disclosure. For the purpose of convenience of description, in the respective embodiments of the present disclosure, the same reference numerals are used to refer to the same elements, and the repeated parts are not described again. Different from the light emitting diode 100 shown in FIG. 1, the first contact 181 of the light emitting diode 300 penetrates through the active layer 130, the second type semiconductor layer 140 and the reflective layer 170, and is electrically connected to the first type semiconductor layer 120. The first contact 181 is electrically insulated from the active layer 130, the second type semiconductor layer 140, the patterned electrode layer 150, and the reflective layer 170 by the insulating layer 180. Furthermore, the insulating layer 180 completely covers the reflective layer 170. Moreover, similar to the light emitting diode 100 illustrated in FIG. 1, the second type semiconductor layer 140 of the light emitting diode 300 also has a roughened second surface 142, and the fourth surface 163 of the planarization layer 160 is substantially flat. Therefore, the light extraction rate of the light emitting diode 300 is improved.

Figure 5:
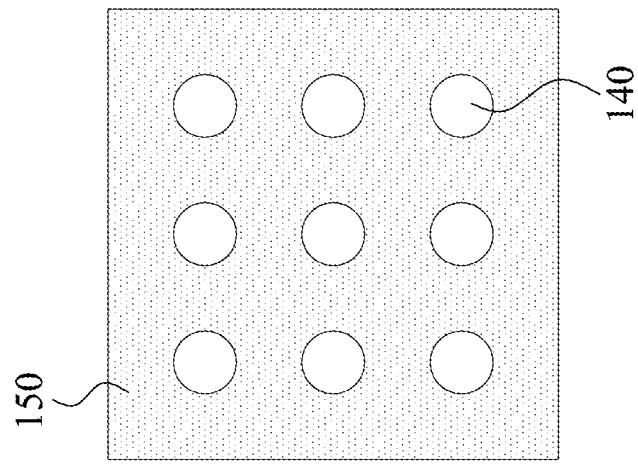
FIG. 5 is a top view of a patterned electrode layer 150 in accordance with an embodiment of the present disclosure.
Figure 4:
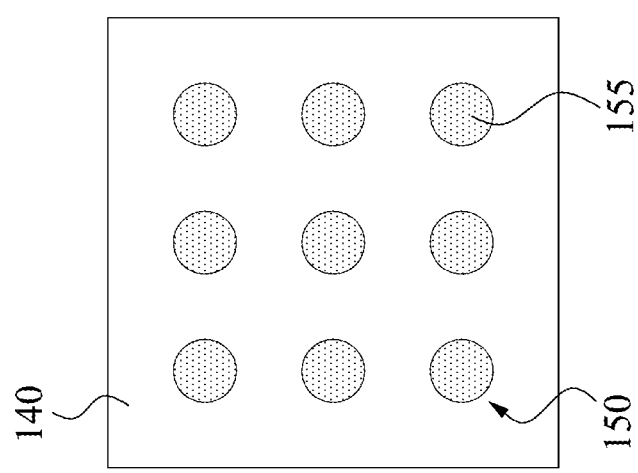
FIG. 4 is a top view of a patterned electrode layer 150 in accordance with an embodiment of the present disclosure.

The present disclosure also provides different aspects of the patterned electrode layer 150. FIGS. 4 and 5 illustrate top views of patterned electrode layer 150 in accordance with various embodiments. Referring to FIG. 4, the patterned electrode layer 150 includes a plurality of electrodes 155, and the each of the electrodes 155 is spaced apart from one another. The gap between the electrodes 155 exposes the second type semiconductor layer 140. Therefore, the patterned electrode layer 150 illustrated in FIG. 4 is also referred to as an "island shape."

Referring to FIG. 5, the patterned electrode layer 150 includes a plurality of openings that expose a portion of the second type semiconductor layer 140. Therefore, the patterned electrode layer 150 illustrated in FIG. 5 is also referred to as a "mesh."

It is to be understood that FIGS. 4 and 5 depict only the exemplary patterned electrode layer 150, and the shape and configuration of the patterned electrode layer 150 can be changed as needed.

The present disclosure provides a structure of a light emitting diode, which improves the problem of total reflection, enhances the reflection effect of the reflective layer, and further increases the light extraction rate of the entire light-emitting diode.

In particular, a P-type doped GaN layer on a P-type doped AlGaN layer in a conventional ultraviolet C-emitting diode (UVC LED) is prone to absorb ultraviolet light C. The structure of the present disclosure can also address the problem of the ultraviolet C light emitting diode described above and improve the light extraction rate.

The features of several embodiments or examples are summarized above so that those skilled in the art can better understand the aspects of the invention. Those skilled in the art will appreciate that the present invention may be readily utilized as a basis for designing or modifying other processes and structures to achieve the same objectives and/or achieve the same advantages of the embodiments described herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode, comprising:
a first type semiconductor layer;
an active layer disposed on the first type semiconductor layer;
a second type semiconductor layer disposed on the active layer, the second type semiconductor layer including a first surface and a second surface opposite thereto, wherein the first surface faces the active layer, and the second surface has a first arithmetic mean roughness;
a patterned electrode layer disposed on the second surface of the second type semiconductor layer and exposing a portion of the second type semiconductor layer;
a planarization layer disposed on the exposed portion of the second type semiconductor layer, wherein the planarization layer includes an opening exposing a portion of the patterned electrode layer, and the planarization layer includes a third surface and a fourth surface opposite to each other, wherein the third surface contacts the second surface of the second type semiconductor layer, and the fourth surface has a second arithmetic mean roughness that is less than the first arithmetic mean roughness;
a reflective layer contacting the fourth surface of the planarization layer, wherein the reflective layer is continuously and integrally formed on the planarization layer and the patterned electrode layer; and
an insulating layer, covering the reflective layer, the planarization layer, sidewalls of the first type semiconductor layer, the active layer, and sidewalls of the second type semiconductor layer.

2. The light emitting diode of claim 1, wherein the patterned electrode layer comprises a plurality of electrodes, and each of the plurality of electrodes is spaced apart from each other.

3. The light emitting diode of claim 1, further comprising a first contact and a second contact, wherein the first contact is electrically connected to the first type semiconductor layer, and the second contact is electrically connected to the reflective layer.

4. The light emitting diode of claim 1, wherein a maximum height roughness of the second surface is greater than 100 Å.

5. The light emitting diode of claim 1, wherein the second arithmetic mean roughness of the fourth surface is less than 3 Å.

6. The light emitting diode of claim 1, wherein the reflective layer covers the patterned electrode layer and the planarization layer.

7. The light emitting diode of claim 1, wherein the reflective layer is electrically connected to the patterned electrode layer through the opening.

8. The light emitting diode of claim 1, wherein the planarization layer comprises an insulating oxide or nitride.

9. The light emitting diode of claim 1, wherein the reflective layer comprises a metal reflective material.

10. The light emitting diode of claim 1, wherein the patterned electrode layer comprises a light-transmitting conductive oxide.

11. The light emitting diode of claim 1, wherein:

the reflective layer comprises a metal reflective material;

the opening of the planarization layer is defined by sidewalls of the planarization layer; and the reflective layer is filled in the opening of the planarization layer, covers and directly contacts the portion of the patterned electrode layer exposed by the opening of the planarization layer, and covers and directly contacts the sidewalls of the planarization layer that define the opening of the planarization layer.

12. The light emitting diode of claim 1, wherein the reflective layer covers and directly contacts an entirety of the sidewalls of the planarization layer.

13. The light emitting diode of claim 3, wherein the first contact is below an interface between the first type semiconductor layer and the active layer, and the second contact is above the interface between the first type semiconductor layer and the active layer.

* * * * *